US008451669B2

(12) United States Patent
Chen et al.

(10) Patent No.: US 8,451,669 B2
(45) Date of Patent: May 28, 2013

(54) MULTI-POWER DOMAIN DESIGN

(75) Inventors: Hsu-Shun Chen, Toufen Town (TW);
Cheng Hung Lee, Hsinchu (TW);
Chung-Ji Lu, Hsinchu (TW);
Hong-Chen Cheng, Hsinchu (TW);
Chung-Yi Wu, Taipei (TW);
Chih-Chieh Chiu, Toufen Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/443,619

(22) Filed: Apr. 10, 2012

(65) Prior Publication Data
US 2012/0195139 A1    Aug. 2, 2012

Related U.S. Application Data

(63) Continuation of application No. 12/708,923, filed on Feb. 19, 2010, now Pat. No. 8,174,911, which is a continuation-in-part of application No. 12/651,231, filed on Dec. 31, 2009, now abandoned.

(51) Int. Cl.
*G11C 7/00*    (2006.01)
(52) U.S. Cl.
USPC ....... 365/189.11; 365/203; 365/205; 365/206
(58) Field of Classification Search
USPC .............................. 365/189.11, 203, 206, 205
See application file for complete search history.

(56) References Cited

U.S. PATENT DOCUMENTS

| 5,475,642 | A | * | 12/1995 | Taylor | 365/203 |
| 5,506,805 | A | | 4/1996 | Hirose et al. | |
| 5,594,696 | A | | 1/1997 | Komarek et al. | |
| 5,991,223 | A | | 11/1999 | Kozaru et al. | |
| 6,009,030 | A | | 12/1999 | Seo | |
| 7,242,627 | B2 | * | 7/2007 | Mizuno et al. | 365/203 |

FOREIGN PATENT DOCUMENTS

CN    101281781    10/2008

OTHER PUBLICATIONS

Office Action dated Mar. 13, 2013 from corresponding application No. CN201010565591.9.

* cited by examiner

*Primary Examiner* — Son Dinh
(74) *Attorney, Agent, or Firm* — Lowe Hauptman Ham & Berner, LLP

(57) ABSTRACT

In some embodiments related to a memory array, a sense amplifier (SA) uses a first power supply, e.g., voltage VDDA, while other circuitry, e.g., signal output logic, uses a second power supply, e.g., voltage VDDB. Various embodiments place the SA and a pair of transferring devices at a local IO row, and a voltage keeper at the main IO section of the same memory array. The SA, the transferring devices, and the voltage keeper, when appropriate, operate together so that the data logic of the circuitry provided by voltage VDDB is the same as the data logic of the circuitry provided by voltage VDDA.

20 Claims, 5 Drawing Sheets ved by reference herein in their entireties.
MULTI-POWER DOMAIN DESIGN

RELATED APPLICATIONS

The present application is a Continuation of U.S. application Ser. No. 12/708,923, filed Feb. 19, 2010, which is a Continuation-in-Part of U.S. application Ser. No. 12/651,231, Dec. 31, 2009, the disclosures of which are hereby incorporated by reference herein in their entireties.

FIELD

One or more embodiments of the present disclosure are generally related to multi-power domains. In various embodiments related to a memory array, a multi-power design does not require a dedicated level shift circuitry in each local input/output (LIO).

BACKGROUND

Multi-power domain provides a good approach to achieve low power applications. For example, depending on situations, a circuitry may be configured to use a lower instead of a higher power supply to reduce power consumption. Traditional approaches generally use a level shift to shift signals between two power domains in a multi-power domain design. In various memory arrays, a level shift circuitry (also referred to as a level shift) is used in every LIO of the memory array. The level shift circuitry, depending on complexity, can include a large number of transistors and associated circuitry. Depending on the size of the array, the number of LIOs can be numerous. For example, in U.S. Pat. No. 5,594,696, the level shift circuit uses about six transistors constituting a relatively large portion of the memory cell. For another example, a 4 Megabit (Mb) memory could include as many as 600 LIOs. As a result, using a level shift in every LIO consumes a large portion of die area, which is generally undesirable, especially in advanced technologies where electronics devices and appliances are continually decreasing in size.

SUMMARY

Some embodiments regard a method comprising: in a read operation of a memory array having a row of local input output connected with a first circuit comprising a sense amplifier and a transferring device using the first circuit to charge a node of the sense amplifier to a first data logic high; using a second circuit to charge a data line to a second data logic high; changing the first data logic high at the node of the sense amplifier to a first data logic low; and using the transferring device to change the second data logic high of the data line to a second data logic low.

Some embodiments regard a circuit comprising: a first circuit including a first supply voltage node arranged to supply a first supply voltage; a pair of nodes of a cross latch; a pair of transferring devices; a first charging circuit; a second circuit including a second supply voltage node different from the first supply voltage node arranged to supply a second supply voltage; a second charging circuit; a pair of data lines coupled to the first circuit and the second circuit; wherein in a read operation the first charging circuit is arranged to charge the pair of nodes of the cross latch to the first supply voltage; the second charging circuit is arranged to charge the pair of data lines to the second supply voltage; a first transferring device is arranged to provide a first data logic low to a first data line of the pair of data lines based on a second data logic low of a first node of the pair of nodes; a second transferring device is arranged to provide a data logic high to a second data line of the pair of data lines.

Some embodiments regard a memory array comprising: a row of memory cells; a row of local IO; a row of main IO; a first circuit associated with the row of local IO and arranged to use a first supply voltage from a first supply voltage node; a second circuit associated with the row of main IO and arranged to use a second supply voltage from a second supply voltage node different from the first supply voltage node; and a data line arranged to have a first data logic based on a second data logic provided by a data node of the first circuit during a read operation of a memory cell of the row of memory cells.

BRIEF DESCRIPTION OF THE DRAWINGS

The details of one or more embodiments are set forth in the accompanying drawings and the description below. Other features and advantages will be apparent from the description, drawings, and claims.

Like reference symbols in the various drawings indicate like elements.

DETAILED DESCRIPTION

Figure 1:
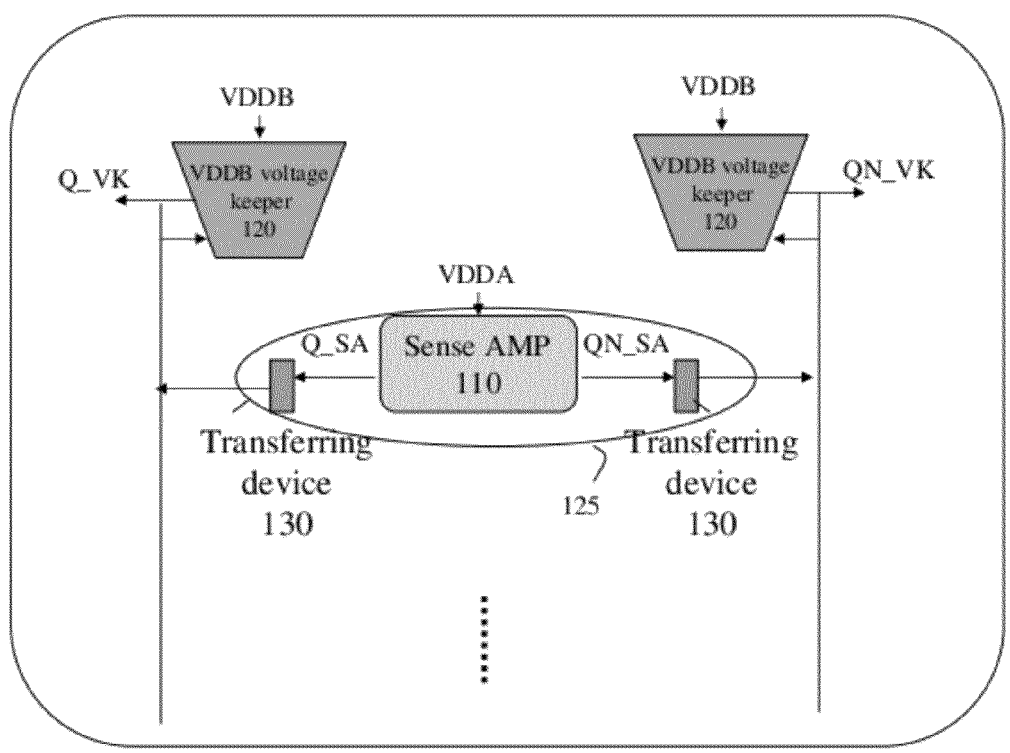
FIG. 1 is a high-level schematic diagram of an exemplary circuit that uses some embodiments.

Embodiments, or examples, of the present disclosure illustrated in the drawings are now being described using specific language. It will nevertheless be understood the embodiments and examples are not intended to be limiting. Any alterations and modifications in the disclosed embodiments, and any further applications of principles disclosed in this document are contemplated as would normally occur to one of ordinary skill in the pertinent art. Reference numbers may be repeated throughout the embodiments, but this does not necessarily require that feature(s) of one embodiment apply to another embodiment, even if they share the same reference number.

In some embodiments related to a memory array, a sense amplifier (SA) (also referred to as a sense amplifier circuit) uses a first power supply, e.g., voltage VDDA, while other circuitry, e.g., signal output logic, uses a second power supply, e.g., voltage VDDB. Various embodiments place the SA and a pair of transferring devices at a local IO row, and a voltage keeper at the main IO section of the same memory array. The SA, the transferring devices, and the voltage keeper, when appropriate, operate together so that the data logic of the circuitry powered by voltage VDDB is the same as the data logic of the circuitry powered by voltage VDDA. Some embodiments do not require a dedicated level shift, e.g., in each LIO in a memory array. The level shift function, instead, can be shared among circuitries of the memory array.

Exemplary Circuit

FIG. 1 is a high-level schematic diagram of a circuit 100 that uses some embodiments. Sense amplifier 110 and voltage keepers 120 are commonly known in the art, and embodiments of the present disclosure are not limited to any particular sense amplifier and/or voltage keeper. Circuit 100 can be referred to as a multi-power domain design because sense amplifier 110 uses a first power supply, e.g., voltage VDDA, while other circuitry (not shown) including voltage keepers 120 use a second power supply, e.g., voltage VDDB. Both voltage VDDA and voltage VDDB are referenced to ground. In some embodiments, transferring devices 130 are configured such that the data logic of the circuitry provided by voltage VDDA is the same as the data logic of the circuitry provided by voltage VDDB. For example, in a read operation, data lines Q_VK and QN_VK are charged to a high data logic provided by voltage VDDB. When appropriate, some embodiments, via transferring devices 130, allow the data logic provided by voltage VDDA to nodes Q_SA and QN_SA to be the same as the data logic provided by voltage VDDB to lines Q_VK and QN_VK. In effect, some embodiments transfer the data logic used in SA 110 that uses supply voltage VDDA to the data lines Q_VK and QN_VK that use supply voltage VDDB.

In some embodiments, circuit 125 comprising a SA 110 and a pair of transferring devices 130 is placed at a particular location, e.g., a row of LIO of a memory array, while a pair of voltage keepers 130 is placed at another location (e.g., the main IO portion of the memory array). Some embodiments save die area because they do not need to use a level shift in each LIO, but circuit 100 having circuits 125 and 120 at appropriate locations provides the level shift function for the memory array.

Exemplary Application

Figure 2:
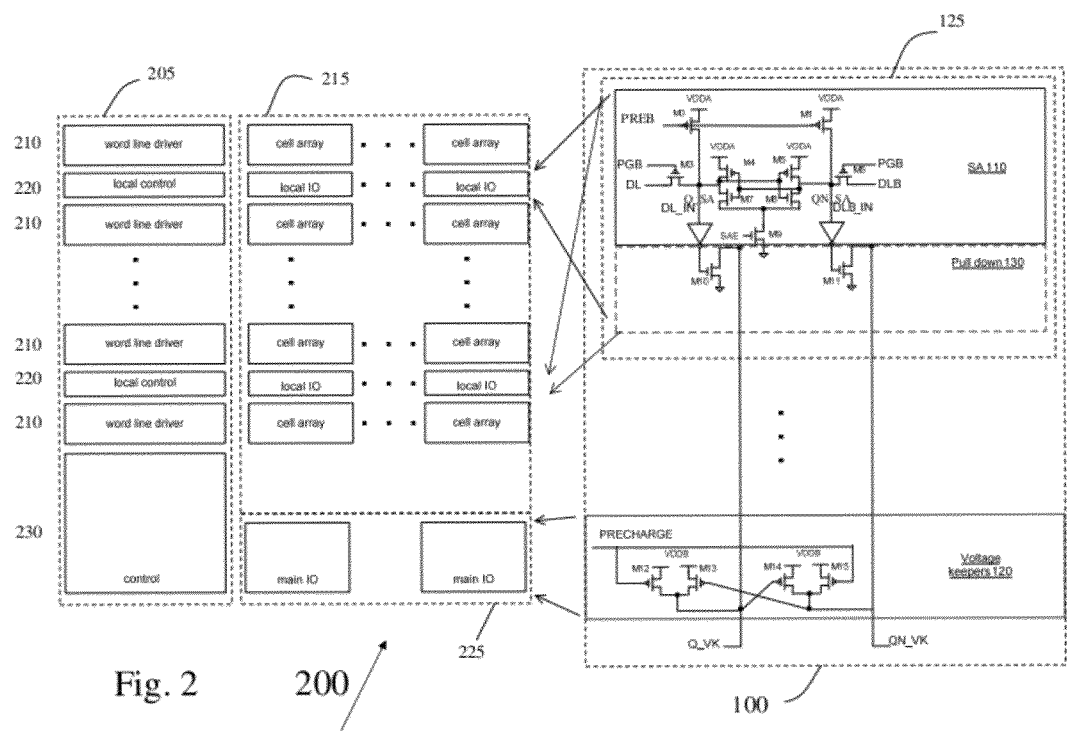
FIG. 2 is a high-level schematic diagram of a memory array utilizing the circuit of FIG. 1, in accordance with some embodiments.

FIG. 2 is a high-level schematic diagram of a memory array 200 utilizing some embodiments. The cell arrays, local IOs, main IOs, main control, word line drivers, and local controls are commonly known in the art. In the configuration of memory array 200, a row of memory cells 210 includes a word line driver and a plurality of cell arrays; a row of LIOs 220 includes a local control circuitry and a plurality of LIOs; and a row of main IOs 230 includes a main control circuitry and a plurality of main IOs. As illustrated, a row of memory cells 210 and a row of LIO 220 are alternating.

In various embodiments, memory array 200 includes circuitry 215 that uses a first supply voltage VDDA, and circuitry 225 that uses a second supply voltage VDDB. In contrast, circuitry 205 uses either of supply voltage VDDA, supply voltage VDDB or another supply voltage (e.g., supply voltage VDDC, not shown).

In various embodiments, a circuit 125 that comprises a SA 110 and a pair of transferring devices 130 is placed at a row of local 10 and is coupled to the memory array via signal PREB, signals DL and DLB, and signal SAE. An NMOS transistor is implemented as a transferring device 130. When appropriate, the logic level of voltage VDDA is provided to node Q_SA and/or QN_SA, which through inverter INV and/or INVB, controls the corresponding NMOS transistor 130. For example, when the data on line Q_SA (and/or QN_SA) is high or at an indicated high level, the data is converted to a low by inverter INV (and/or INVB), and thus turns off the corresponding transistor 130, which allows the voltage level at their drains (e.g., lines Q_VK and/or QN_VK) to remain at the high logic level previously charged by voltage VDDB. But when the data on line Q_SA (and/or QN_SA) is low, the data is converted to a high and turns on the corresponding transistor 130, which pulls the high data at the drain of the corresponding transistor 130 to the level of its source (e.g., ground or low). In effect, NMOS transistors 130 transfer the data logic (e.g., a low or high logic) at nodes Q_SA and QN_SA to lines Q_VK and QN_VK, respectively. Because, in some embodiments, NMOS transistors 130 pull the high logic level on lines Q_VK and/or QN_VK to the low logic level, NMOS transistors 130 can be called pull down devices, pull down transistors 130, etc.

Voltage keeper 120 is placed in the same row as main IO row 230, and is coupled to the memory array via signal PRECHARGE.

In various embodiments, circuit 125 being placed at a row of LIO saves die area because it enables embodiments to not use a dedicated level shift in every local IO. The embodiments are advantageous because various circuitries that transfer the data logic are distributed at different locations to minimize the required circuitries in each LIO, while transferring the desired data logic.

Circuit Embodiment

Figure 3:
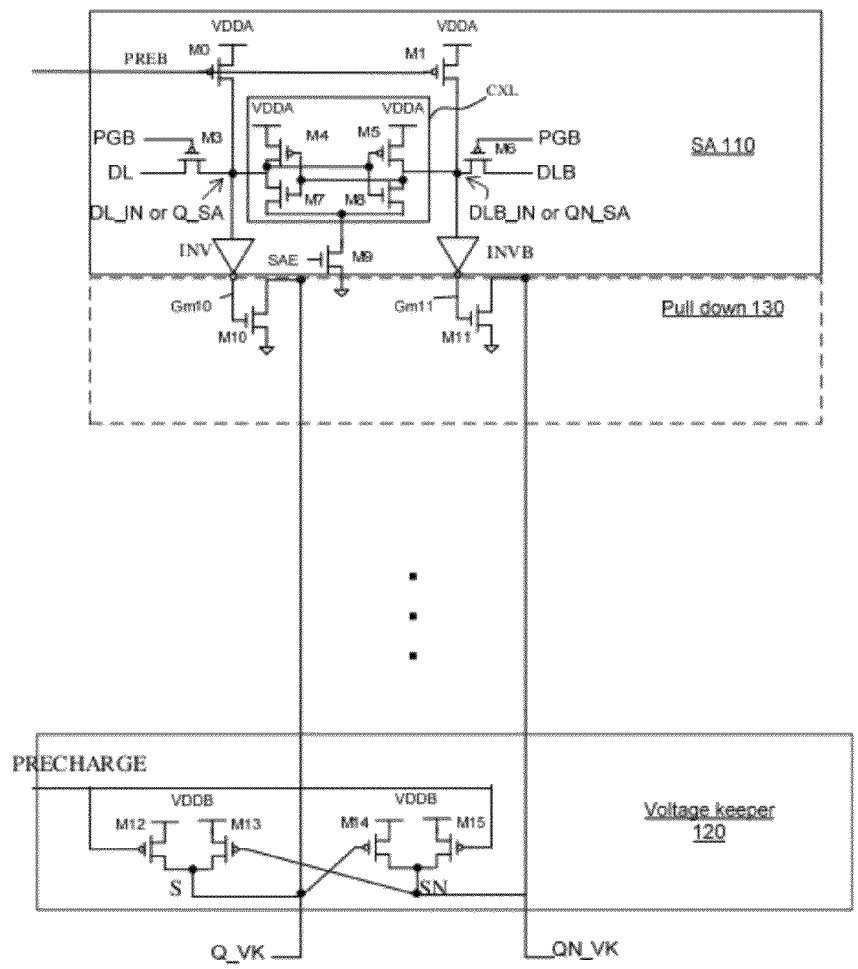
FIG. 3 is a detailed schematic diagram of the circuit in FIG. 1, in accordance with some embodiments.

FIG. 3 is a detailed schematic diagram of circuit 100, in accordance with some embodiments.

Signal PREB controls transistors M0 and M1 to charge (e.g., pre-charge) nodes DL_IN and DLB_IN. For example, when signal PREB is activated (e.g., low) and supplied to the gate of transistors M0 and M1, transistors M0 and M1 turn on so that voltage VDDA is transferred to nodes DL_IN and DLB_IN. When signal PREB is deactivated (e.g., high), transistors M0 and M1 turn off and there is no pre-charge.

Signal PGB controls transistors M3 and M6. For example, when signal PGB is activated (e.g., low) and supplied to the gate of transistors M3 and M6, transistors M3 and M6 turn on and allow the transfer of data on lines DL and DLB to nodes DL_IN and DLB_IN. When signal PGB is deactivated (e.g., high), transistors M3 and M6 turn off and there is no data transfer.

Transistors M4 and M7, and M5 and M8 form the cross latch (e.g., cross latch CXL,) for SA 110.

Signal SAE controls transistor M9, which in turn controls cross latch CXL. When signal SAE is activated (e.g., high), transistor M9 turns on providing a current path for cross latch CXL and thus activates cross latch CXL. Stated alternatively, cross latch CXL is ready sensing data at nodes Q_SA (or DL_IN) and QN_SA (or DLB_IN), which are commonly referred to as the internal nodes of SA 110.

When appropriate (e.g., in a read cycle), inverters INV and INVB together with transistors M10 and M11 allow the data logic at respective nodes Q_SA and QN_SA to be the same as the data logic on the corresponding lines Q_VK and QN_VK. That is, if node Q_SA is at a high logic level then line Q_VK is at a high logic level, but if node Q_SA is at a low logic level then line Q_VK is at a low logic level. Similarly, if node QN_SA is at a high logic level then node QN_VK is at a high logic level, but if node QN_SA is at a low logic level then line QN_VK is at a low logic level. Inverters INV and INVB invert data at nodes Q_SA and QN_SA to provide the appropriate levels to control transistors M10 and M11. For example, when the data at nodes Q_SA and QN_SA are high, inverters INV and INVB convert this high level to a low and thus turn off transistors M10 and M11. Because transistors M10 and M11 are off, they are electrically disconnected from lines Q_VK and QN_VK. As a result, the data on lines Q_VK and QN_VK remain at the logic level previously provided to lines Q_VK and QN_VK. For another example, in a read cycle, after lines Q_VK and QN_VK are charged to the high logic level of voltage VDDB, lines Q_VK and QN_VK remain at the high logic level provided by voltage VDDB. But when the data at nodes Q_SA and QN_SA are low, inverters INV and INVB convert this low level to a high and thus turn on transistors M10 and M11. When transistor M10 is on, transistor M10 pulls the data on line Q_VK (e.g., the drain of transistor M10) to the logic level at the source of transistor M10 (e.g., ground or low logic level). Similarly, when transistor M11 is on, transistor M11 pulls the data on line QN_VK (e.g., the drains of transistor M11) to the level at the source of transistor M11 (e.g., ground or low logic level). As can be seen from the above illustration, the data logic at nodes Q_SA and QN_SA are the same as the data logic on lines Q_VK and QN_VK because when nodes Q_SA and QN_SA are at high logic level, lines Q_VK and QN_VK are at high logic level, but when nodes Q_SA and QN_SA are at low logic level, lines Q_VK and QN_VK are at low logic level.

Signal PRECHARGE controls transistors M12, M13, M14, and M15, charging lines Q_VK and QN_VK. When signal PRECHARGE is activated (e.g., driven low), transistors M12 and M15 turns on, allowing voltage VDDB to be transferred to nodes S and SN, which are lines Q_VK and QN_VK.

Illustrative Method

Figure 4:
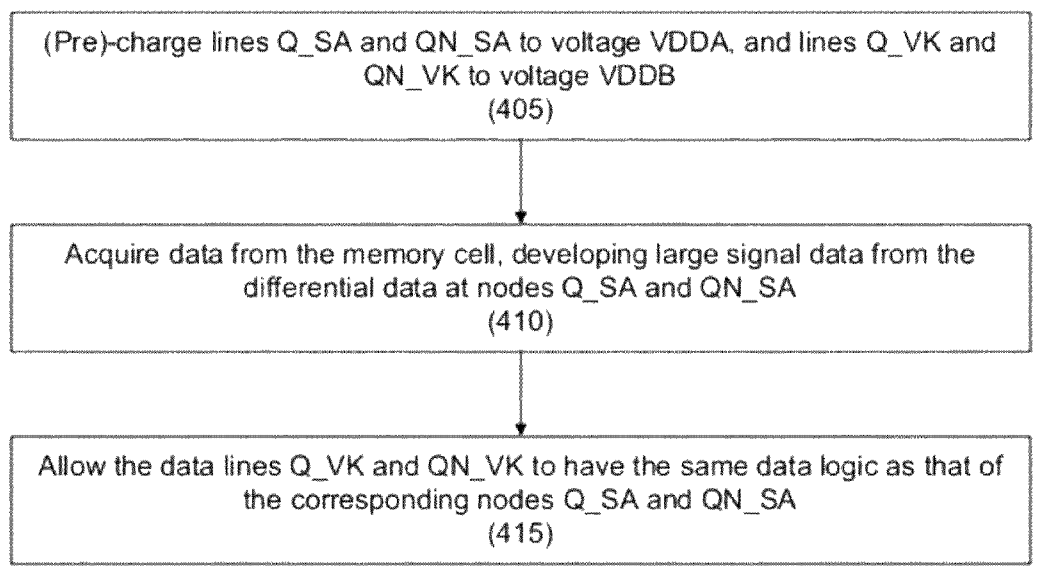
FIG. 4 is a flowchart illustrating a method in accordance with some embodiments.

FIG. 4 is a flowchart 400 illustrating a method in accordance with some embodiments. In this illustration, the embodiment is related to a read operation of a memory cell in the memory array of FIG. 2, and the embodiment desires to have the data logic on lines Q_VK and QN_VK to be the same as the data logic at nodes Q_SA and QN_SA. For illustration purposes, the data to be read is low on line Q_VK and high on line QN_VK, but principles of the embodiment are equally applicable if the data to be read is high on line Q_VK and low on line QN_VK.

In block 405, the method embodiment (pre-)charges lines Q_SA and QN_SA to voltage VDDA, and lines Q_VK and QN_VK to voltage VDB. The method embodiment activates signals PREB and PRECHARGE. The activated signal PREB turns on transistors MO and M1 that allow nodes Q_SA and QN_SA to be (pre)-charged to a high level of voltage VDDA. This high level being low through inverters INV and INVB turns off transistors M10 and M11. The activated signal PRECHARGE turns on transistors M12 and M14, (pre)-charging lines Q_VK and QN_VK, or allowing voltage VDDB of transistors M12 and M14 to be transferred to lines Q_VK and QN_VK. The embodiment also deactivates signal PGB and signal SAE, which turns off transistors M3 and M6 and cross latch CXL. In effect, the embodiment prepares for lines Q_VK and QN_VK to follow the data logic of nodes Q_SA and QN_SA respectively.

In block 410, the embodiment acquires data from the memory cell, developing the electrical large signals from the differential signals at nodes Q_SA and QN_SA. The embodiment activates signal PGB to turn on transistors M3 and M6 and allow the differential data on lines DL and DLB to be transferred to lines DL_IN and DLB_IN. The data on lines DL and DLB comprise the data to be read from the memory cell, which start to discharge either line DL or DLB to develop the large signals from the differential signals DL and DLB (or DL_IN and DLB_IN). For illustration, the data discharges line DLB and thus line DLB_IN, but principles of the embodiment are equally applicable if the memory data discharges line DL and thus line DL_IN. In block 410, the embodiment deactivates signals PREB and PRECHARGE.

In block 415, the embodiment allows the data lines Q_VK and QN_VK to have the same data logic as that of the corresponding nodes Q_SA and QN_SA. The embodiment activates signal SAE to turn on transistor M9, which provides a current path for and thus turns on cross latch CXL. At this time, data line DLB (or QN_SA) has been discharged to a low logic level (e.g., ground). Because the data low appears at node QN_SA, inverter INVB inverts this data low to a high at the gate Gm11 of transistor M11, which turns on transistor M11. Because transistor M11 turns on, the high data at its drain (e.g., line QN_VK) is pulled to the voltage level at its source, which is ground or low. In effect, the low logic level on line QN_VK is the same as the low logic level at node QN_SA.

At the same time, the high logic data provided (e.g., charged) by voltage VDDA to node Q_SA remains the same. Inverter INV inverts the high logic data at node Q_SA to a low logic at the gate Gm10 of transistor M10, which turns off transistor M10. Because transistor MO turns off, the voltage at its drain (e.g., line Q_VK) remains at the previous high level provided (e.g., charged) by voltage VDDB. In effect, the high data logic on line Q_VK is the same as the high data logic at node Q_SA. The high data logic on line Q_VK and the low data logic on line QN_VK are the actual read data, which, as illustrated, reflect the data logic at nodes Q_SA and QN_SA, respectively.

Illustrative Waveforms

Figure 5:
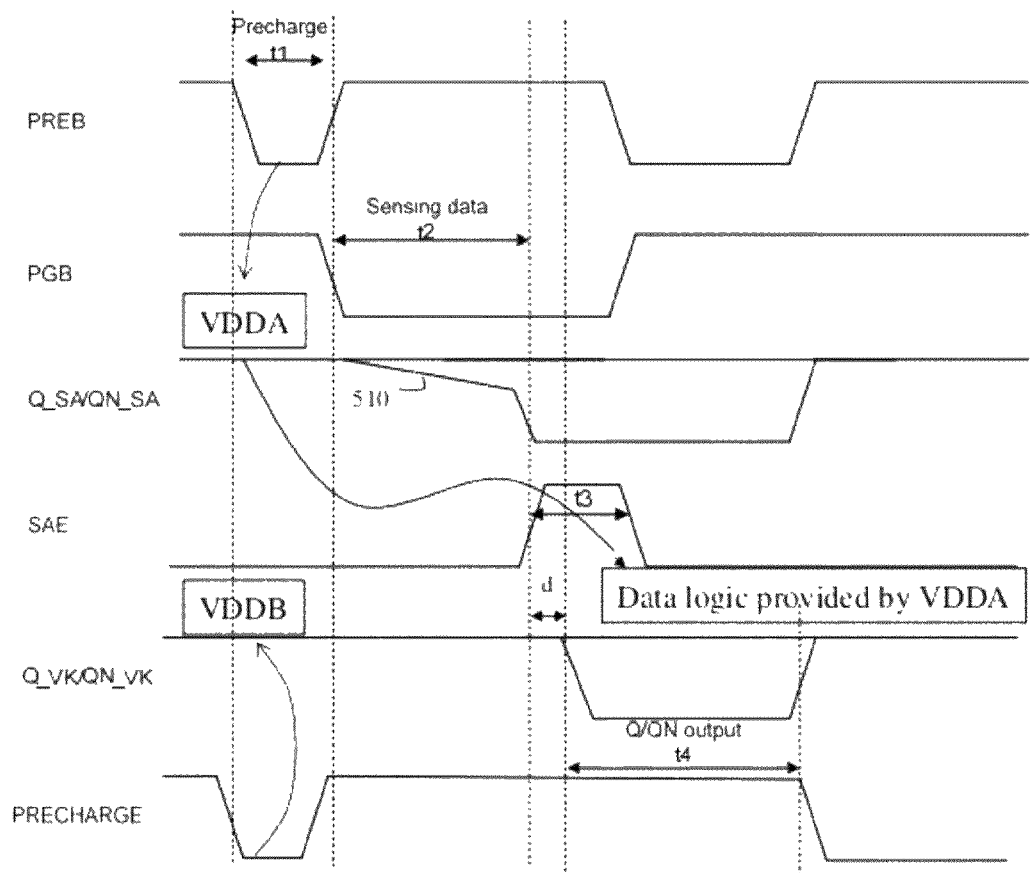
FIG. 5 is a graph of waveforms illustrating the operation of the memory array in FIG. 2, in accordance with some embodiments.

FIG. 5 is a graph of waveforms 500 illustrating operation of memory array 200 (FIG. 2) in conjunction with circuit 100 (FIG. 1).

During time period t1, signals PREB being activated low (pre)-charges nodes Q_SA (or DL_IN) and QN_SB (or DLB_IN) to the high level of voltage VDDA. Signal PRECHARGE being activated low (pre)-charges lines Q_VK and QN_VK to voltage level VDDB. Signal SAE being deactivated low turns off transistor M9, which effectively turns off the cross latch CXL. Stated another way, during time period t1, signal PRECHARGE sets the initial condition on lines Q_VK and QN_VK, e.g., allowing these lines to have the high level of voltage VDDB. After this time period t1, signal PRECHARGE is deactivated high so that lines Q_VK and QN_VK are ready for receiving data from other circuitry. After this pre-charge time period t1, signal PREB also returns to being deactivated high.

During time period t2, signal PGB being activated low turns on transistors M3 and M6. As a result, data from lines DL and DLB are transferred to nodes DL_IN (or Q_SA) and DLB_IN (or QN_SA). Time period t2 can be referred to as the sensing time because during this time period t2, depending on the read data in the memory cell, one of the data line DL_IN or DLB_IN is pulled low while the other data line stays high, which is illustrated by the slope of line 510.

During time period t3, signal SAE being activated high turns on transistor M9 enabling the reading function. After some delay d that starts time period t4 the data at nodes Q_SA and QN_SA are transferred via transistors M10 and M11 to node Q_VK and QN_VK, respectively. Consistent with the illustration of step 415 in FIG. 4, the data at node QN_SA is low, the voltage at gate Gm11 is high at the level of voltage VDDA, which turns on transistor M11, and pulls the data on line QN_VK to low. At the same time, the data at node Q_SA is high, the voltage at gate Gm10 is low, which turns off transistor M10, and allows the data on line Q_VK to remain at the high level provided by voltage VDDB. The data on line QN_VK and/or Q_VK are read by/driven to other circuitry during time period t4, which for illustration, is shown as Q/QN output. The time delay period d indicates a time delay which occurs after signal SAE is activated before the data on lines Q_VK and QN_VK is readable.

A number of embodiments have been described. It will nevertheless be understood that various modifications may be made without departing from the spirit and scope of the present disclosure. For example, the embodiments of SA 110 and voltage keeper 120 shown in FIG. 3 are for illustration. Other comparable sense amplifiers and/or voltage keepers are within the scope of embodiments of the present disclosure. Similarly, transistors M10 and M11 are for illustration, other comparable circuits allowing the transfer of data between two power domains (e.g., from nodes Q_SA and QN_SA to nodes Q_VK and nodes QN_VK) are within scope of embodiments of the present disclosure. Depending on implementations, an inverter INV and/or INVB may be part of SA 110 or transferring device 130; transferring devices 130 may be part of SA 110, etc., but embodiments of the present disclosure are not so limited, a circuit transferring the data from nodes Q_SA and/or QN_SA to lines Q_VK and/or QN_VK are within the scope of the present disclosure. The above method embodiment shows exemplary steps, but they are not necessarily performed in the order shown. Steps may be added, replaced, changed order, and/or eliminated as appropriate, in accordance with the spirit and scope of embodiments of the present disclosure.

Each claim of this document constitutes a separate embodiment, and embodiments that combine different claims and/or different embodiments are within scope of the present disclosure and will be apparent to those skilled in the art after reviewing this disclosure. Accordingly, the scope of the invention should be determined with reference to the following claims, along with the full scope of equivalences to which such claims are entitled.

What is claimed is:

1. A method comprising:
   using a first circuit to charge a node of a sense amplifier to a first data logic level;
   using a second circuit to charge a data line to the first data logic level;
   changing the first data logic level at the node of the sense amplifier to a second data logic level; and
   using a transferring device to change the data line to the second data logic level.

2. The method of claim 1, wherein using the first circuit to charge the node comprises using a first voltage corresponding to the first data logic level of the node and is provided by a first supply voltage node, and
   using the second circuit to charge the data line comprises using a second voltage corresponding to the first logic level of the data line and is provided by a second supply voltage node different from the first supply voltage node.

3. The method of claim 1, wherein using the transferring device comprises using an n-type metal-oxide-semiconductor transistor.

4. The method of claim 3, wherein using the NMOS transistor comprises using a voltage level at the node to control the NMOS transistor.

5. The method of claim 3, wherein a drain of the NMOS transistor is coupled to the data line and a source of the NMOS transistor is coupled to ground.

6. The method of claim 1, wherein changing the first data logic level at the node of the sense amplifier is based on data received from a memory cell of a memory array.

7. The method of claim 1, further comprising:
   using the second circuit to charge a second data line to the first data logic level; and
   using a second transferring device to maintain the first data logic level at the second data line.

8. A circuit comprising:
   a first circuit including
     a first supply voltage node arranged to supply a first supply voltage;
     a pair of nodes of a cross latch;
     a first transferring device configured to be controlled by a first node of the pair of nodes;
     a second transferring device configured to be controlled by a second node of the pair of nodes;
     a first charging circuit;
   a second circuit including
     a second supply voltage node different from the first supply voltage node and arranged to supply a second supply voltage;
     a second charging circuit; and
   a pair of data lines coupled to the first circuit and the second circuit.

9. The circuit of claim 8, wherein the pair of data lines is configured to receive data from a memory cell of the memory array, and each of the pair of data lines is connected to a respective one of the pair of nodes.

10. The circuit of claim 8, wherein the second circuit further comprises at least one pair of transistors configured to connect the second supply voltage node to the pair of data lines.

11. The circuit of claim 8, further comprising a memory cell configured to provide data, and the first transferring device configured to provide a first data logic level to a first data line of the pair of data lines and the second transferring device configured to provide a second data logic level to a second data line of the pair of data lines based on the data.

12. The circuit of claim 8, wherein at least one of the first transferring device or the second transferring device comprises an inverter coupled between a node of the pair of nodes and a gate of an NMOS transistor having a drain coupled to a data line of the pair of data lines.

13. The circuit of claim 8, wherein the pair of data lines is configured to output a data logic level of the pair of nodes.

14. A circuit comprising:
   a first charging circuit arranged to charge a pair of nodes of a cross latch to a first supply voltage;
   a second charging circuit arranged to charge a pair of data lines to a second supply voltage;
   a first transferring device arranged to provide a first data logic level to a first data line of the pair of data lines based on a first stored data logic level of a first node of the pair of nodes; and
   a second transferring device arranged to provide a second stored data logic level to a second data line of the pair of data lines.

15. The circuit of claim 14, wherein the first node is configured to control the first transferring device.

16. The circuit of claim 14, wherein a second node of the pair of nodes is configured to control the second transferring device.

17. The circuit of claim 16, wherein the first transferring device includes an n-type metal-oxide-semiconductor transistor configured to provide the first stored data logic level to a first data line of the pair of data lines.

18. The circuit of claim 17, wherein the first transferring device further comprises an inverter arranged to provide a signal to control the NMOS transistor.

19. The circuit of claim 14, wherein the second circuit further comprises at least one pair of transistors configured to connect the second supply voltage node to the pair of data lines.

20. The circuit of claim 14, wherein the pair of data lines is configured to output a data logic level of the pair of nodes.

* * * * *